United States Patent
Zhu et al.

(10) Patent No.: US 7,855,907 B2
(45) Date of Patent: Dec. 21, 2010

(54) MITIGATION OF CHARGE SHARING IN MEMORY DEVICES

(75) Inventors: Xiaowei Zhu, Plano, TX (US); Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 232 days.

(21) Appl. No.: 12/338,393

(22) Filed: Dec. 18, 2008

(65) Prior Publication Data

US 2010/0157642 A1 Jun. 24, 2010

(51) Int. Cl.
*G11C 5/02* (2006.01)

(52) U.S. Cl. .................... 365/51; 365/174; 365/177

(58) Field of Classification Search ............. 365/51, 365/174, 177

See application file for complete search history.

(56) References Cited

U.S. PATENT DOCUMENTS

| 5,157,625 | A | 10/1992 | Barry |
| 6,545,904 | B2 * | 4/2003 | Tran .................. 365/149 |
| 6,825,077 | B2 * | 11/2004 | Tran .................. 438/241 |

OTHER PUBLICATIONS

"Upset Hardened Memory Design for Submicron CMOS Technology", T. Calin, M. Nicolaidis and R. Velazco, IEEE Transactions on Nuclear Science, vol. 43, No. 6, Dec. 1996, pp. 2874-2878.
"See Analysis and Mitigation for FPGA and Digital ASIC Devices", Roland Weigand eesa Microelectronics Section, University of Surrey, Dec. 7, 2005, 28 pgs.

* cited by examiner

*Primary Examiner*—Son Dinh
(74) *Attorney, Agent, or Firm*—Rose Alyssa Keagy; Wade J. Brady, III; Frederick J. Telecky, Jr.

(57) ABSTRACT

One embodiment relates to a memory element disposed on a substrate. The memory element includes first and second interlocked data storage elements adapted to cooperatively store the same datum. An output of the first data storage element is coupled to an input node of the second data storage element. An output of the second data storage element is coupled to an input of the first data storage element. An isolation element in the substrate is arranged laterally between storage nodes of the first and second data storage elements. The isolation element is arranged to limit charge sharing between the storage nodes of the first and second data storage elements. Other methods and systems are also disclosed.

19 Claims, 5 Drawing Sheets

MITIGATION OF CHARGE SHARING IN MEMORY DEVICES

FIELD

The present invention relates generally to integrated circuits and more particularly to radiation hardening techniques for memory devices.

BACKGROUND

Semiconductor memory devices store data and/or program code for many types of electronic systems. These electronics systems include personal computer systems, cellular phones, music players (e.g., MP3 players), image processing circuits, and the like. In order for these memory devices to be useful, it is important that they accurately store data.

Radiation is one factor that may contribute to data errors in these memory devices. When a single charged particle, for example an alpha particle, travels through a semiconductor, it leaves an ionized trail behind it. The ionization may affect the device in one of several ways. For example, the ionization can cause a temporary glitch, can cause a bit in a memory cell or register to "flip", or can even cause destructive latch-up and burnout.

A "bit flip" occurs when a single radiation event interacts with the device and causes a memory cell or register cell to change state. Such a flip or upset in bit state is referred as single-event upset (SEU), These SEUs do not necessarily cause lasting damage to the device, but may cause lasting problems to a system that cannot recover from such an error. In some devices, a single radiation event can also cause a multiple-bit upset (MBU) that flips data in several adjacent memory cells.

In order to ensure proper operation of memory devices and other electrical systems, manufacturers of integrated circuits use various methods of radiation hardening to protect against radiation events. The present invention relates to methods and systems for mitigating the effects of radiation on integrated circuits.

BRIEF SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment relates to a memory element disposed on a substrate. The memory element includes first and second interlocked data storage elements adapted to cooperatively store the same datum. An output of the first data storage element is coupled to an input node of the second data storage element. An output of the second data storage element is coupled to an input of the first data storage element. An isolation element in the substrate is arranged laterally (e.g., in parallel to wafer surface) between storage nodes of the first and second data storage elements. The isolation element is arranged to limit charge sharing between the storage nodes of the first and second data storage elements. Other methods and systems are also disclosed.

The following description and annexed drawings set forth in detail certain illustrative aspects and implementations of the invention. These are indicative of only a few of the various ways in which the principles of the invention may be employed.

DETAILED DESCRIPTION

Figure 1:
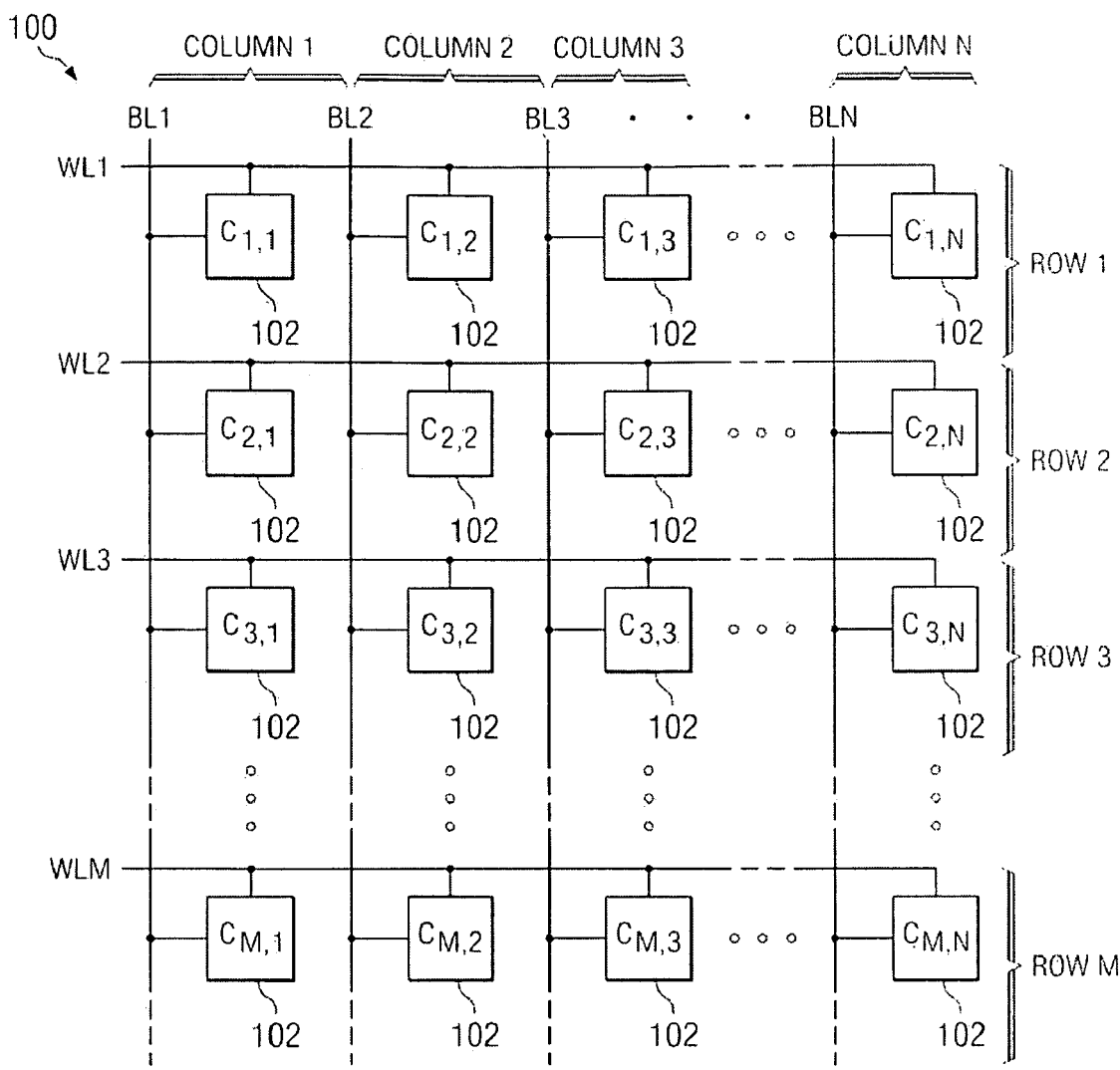
FIG. 1 is a schematic diagram illustrating a memory array.

One or more implementations of the present invention will now be described with reference to the attached drawings, wherein like reference numerals are used to refer to like elements throughout.

Referring now to FIG. 1, one can see a memory array 100 that includes a number of memory cells 102 that are each capable of storing one or more bits of data, depending on the implementation. The cells 102 are arranged in M rows (e.g., words) and N columns (e.g., bits), indicated as $C_{ROW,COLUMN}$.

Consequently, each row of cells is an N bit data word accessible by activation of a wordline WL associated with that row. For example, in the first row of the array 100, the cells $C_{1,1}$ through $C_{1,N}$ form an N bit data word that may be accessible by activation of wordline WL1 via bitlines BL1 through BLN. Generally speaking, while the wordline is asserted, data values can be read from or written to the cells in the corresponding row by properly biasing the bitlines.

Figure 2:
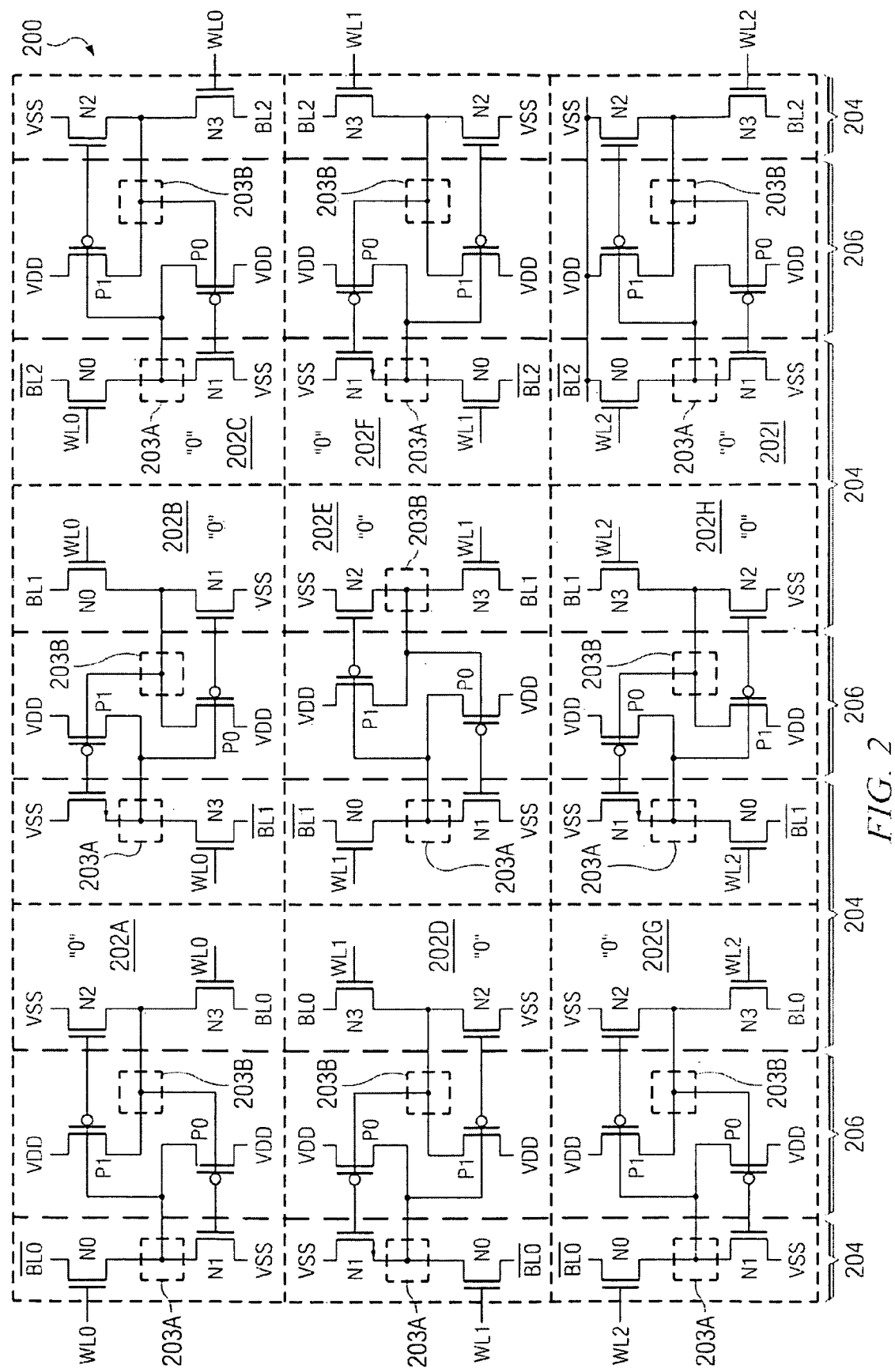
FIG. 2 is a schematic diagram illustrating a section of a memory array that includes SRAM memory cells.

For purposes of illustration, FIG. 2 shows a more detailed section of a memory array 200 that includes nine SRAM memory cells 202A-202I in accordance with some aspects of the invention. Each SRAM memory cell 202A-202I includes six transistors: four n-type transistors (N0, N1, N2, N3), and two p-type transistors (P0, P1). In essence, data is stored in each cell at a pair of cross-coupled data storage nodes 203A, 203B, where the data storage nodes 203A, 203B are accessible via access transistors (N0, N3). The SRAM cells are laid out such that the PMOS transistors P0, P1 are aligned within a vertically continuous n-well 206. The NMOS transistors N0, N1, N2, N3 of each cell are aligned within vertically continuous p-type regions 204 that abut opposing sides of the n-well 206. In this manner, p-type regions and n-type regions form alternating vertical "stripes".

For purposes of completeness, each memory cell is shown with a "0" bit state. A bit state is defined here as the same logic state as the logic state of the right storage node in FIG. 2. Within each cell, the left storage node 203A stores one data value, and the right storage node 203B stores a complementary value. For example, in cell 202A, the left storage node 203A stores a voltage logically associated with a "1" value and the right storage node 203B stores a voltage logically associated with a "0" value.

By studying how single radiation events create bit-flips in the memory array 200, the inventors have appreciated that isolation elements (e.g., the junction between the n-well 204 and p-type regions 206) mitigate multiple-bit upsets for several adjacent memory cells.

Figure 3:
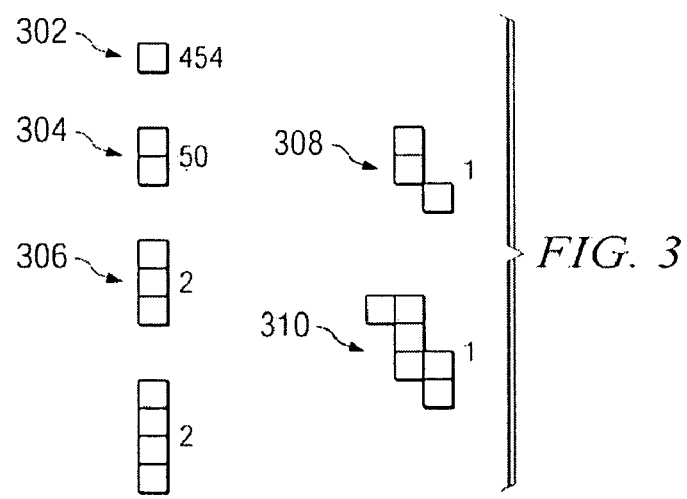
FIG. 3 is a schematic diagram illustrating patterns of bit fails in the memory.

For example, FIG. 3 shows several failure patterns in measured errors caused by five-hundred and ten radiation events in a memory array. As shown at numeral 302, four-hundred and fifty four of these events resulted in an error that "flipped" data in a single memory cell. For example, the "0" bit in cell 202B of FIG. 2 could be flipped from a "0" to a "1", thereby causing a subsequent read operation to obtain an incorrect read value of "1" for this single cell. At numeral 304, fifty of these radiation events "flipped" bits in two vertically adjacent memory cells. For these fifty events, the charge associated with the radiation event was dispersed between the two vertically adjacent memory cells and was sufficient to "flip" the data in both cells. For example, numeral 304 could relate to bits of cells 202B and 202E in FIG. 2 being flipped. At numeral 306, two events "flipped" data in three vertically adjacent memory cells, such as cells 202B, 202E, and 202H, and so on. Notably, the inventors have appreciated that only two radiation events out of the five-hundred and ten total events (i.e., corresponding to reference numerals 308, 310) cause multi-cell failures that are due to the fact that the charge collection occurred across the junction between the n-well 204 and p-type region 206.

In light of this finding, the inventors have devised this and other memory arrays where an isolation structure, such as a p-n junction surrounding an n-well, is strategically arranged to limit charge sharing between adjacent memory cells or within single data storage elements. In this manner, multiple-bit upsets can be reduced in memory arrays, and single bit upsets can be reduced in dual interlocked storage cells (DICE cells). Reduction of multi-bit upsets is particularly important because error-correction coding (ECC) routines can correct single-bit errors, but are unable to efficiently diagnose and repair multiple-bit errors in a word. Therefore, by limiting the number of multiple-bit errors, an isolation structure can significantly improve the functionality of electronic devices that use memory elements.

Although FIG. 2 discusses an embodiment where the isolation structure is an n-well, in some other embodiments the isolation structure could include other features that limit charge sharing between elements. For example, in another embodiment, storage nodes (e.g., nodes 203 in FIG. 2) that are susceptible to bit-flips will be separated by a length of substrate, for example at least approximately 1 micron, that is sufficient to mitigate multiple adjacent bit upsets. In still another embodiment, other isolation structures, such as shallow trench isolation (STI) could be used to limit charge sharing between adjacent memory cells.

Figure 4:
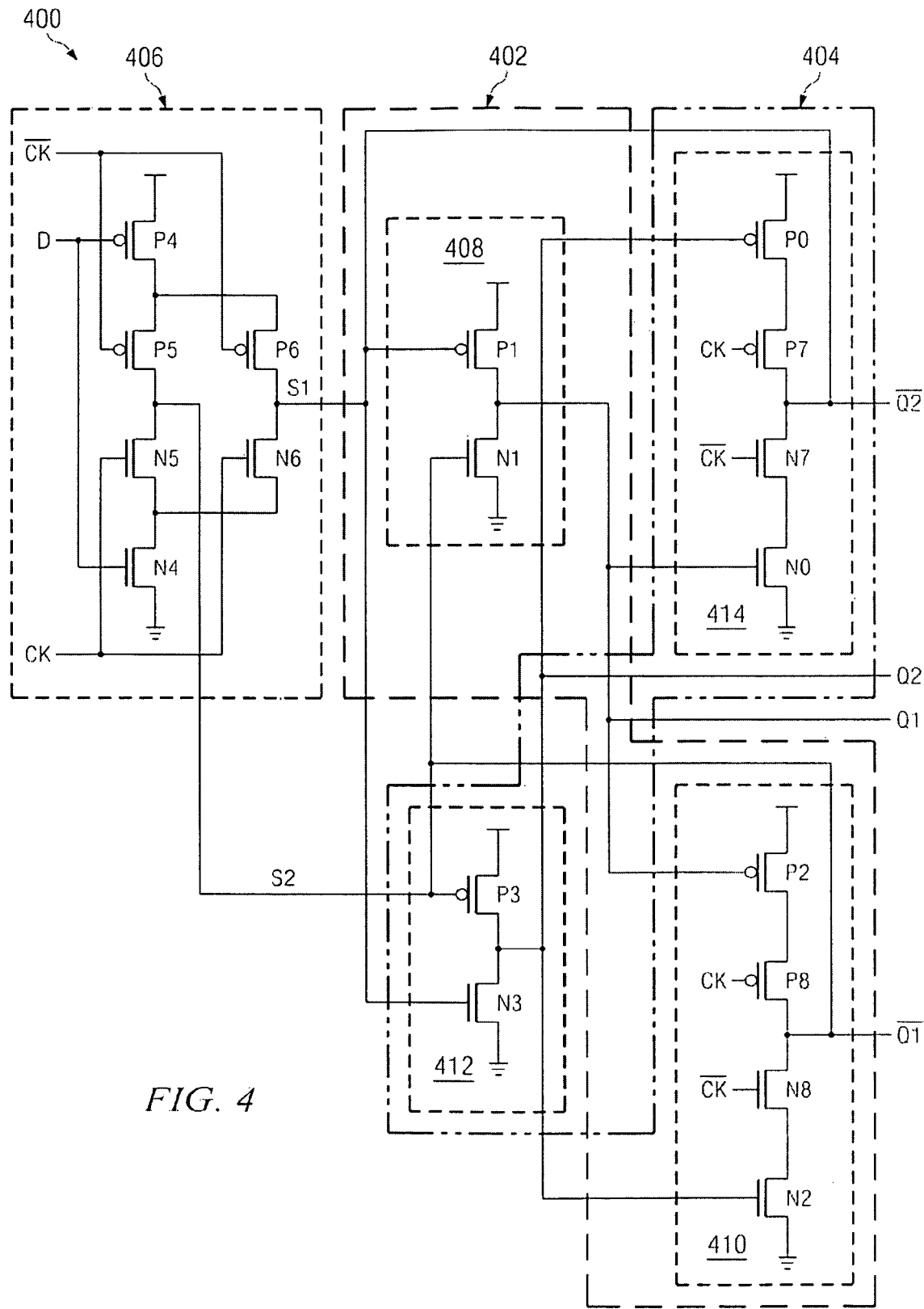
FIG. 4 is a schematic diagram illustrating a DICE memory element that mitigates errors due to charge sharing.

Referring now to FIG. 4, one can see an example of a Dual Interlocked storage CEII (DICE cell) 400 that incorporates an isolation structure as discussed above. Isolation structures are particularly advantageous in the context of DICE cells, because as feature sizes shrink it becomes more and more likely that charge sharing (e.g., alpha-particles) will affect adjacent storage elements. Therefore, even though previous DICE cells may tend to provide radiation hardening functionality, these previous DICE cells will be more prone to bit-flips as feature sizes on the integrated circuit are reduced for future technology nodes. Therefore, the present isolation structures reduce bit flips while concurrently allowing feature sizes to be reduced.

The DICE cell 400 includes first and second interlocked data storage elements, 402, 404 respectively. Control circuitry 406 provides control signals to the first and second data storage elements 402, 404, thereby causing each data storage element to store the same data (Q1, Q2) and the same complimentary data ($\overline{Q1}$, $\overline{Q2}$). By storing the same data, the first and second data storage elements 402, 404 can self-correct data-bits that are flipped due to single radiation events. Thus, even if a single radiation event hits a node within a given data storage element (e.g., corrupting datum Q1), the other data storage element provides state-restoring feedback so that the DICE cell 400 recovers back to its original, uncorrupted data state.

To facilitate this behavior, the first data storage element 402 includes a first stage 408 and a second stage 410. The second data storage element 404 also includes two stages, namely a third stage 412 and a fourth stage 414.

The first stage 408 includes a PMOS transistor (P1) and an NMOS transistor (N1). The PMOS transistor P1 receives its input signal, which is a superposition of a first output signal S1 from the control circuit 406 and an output ($\overline{Q2}$) from the fourth stage 414. The NMOS transistor (N1) receives its input signal, which is a superposition of a second output S2 of the control circuit and an output of the second stage 410. The first stage 408 has an output (Q1) coupled to an input of the second stage 410.

The second stage 410 includes two NMOS transistors N2, N8 and two PMOS transistors P2, P8, where PMOS and NMOS transistors P8, N8 receive a clock signal (CLK) and inverse clock signal $\overline{CK}$, respectively. The second stage 410 outputs first complimentary data ($\overline{Q1}$).

Somewhat similarly, the second data storage element 404 includes a third stage 412 having a PMOS transistor P3 and an NMOS transistor N3. The PMOS transistor P3 receives its input signal, which is a superposition of the second output signal S2 from the control circuit 406 and an output (Q2) from the second stage 414. The NMOS transistor (N3) receives its input signal, which is a superposition of the first output S1 of the control circuit and an output $\overline{Q2}$ of the second stage 410. The first stage 408 has an output (Q1) coupled to an input of the fourth stage 414.

The fourth stage 414 includes two NMOS transistors N0, N7 and two PMOS transistors P0, P7, where PMOS and NMOS transistors P7, N7 receive a clock signal (CLK) and inverse clock signal $\overline{CK}$, respectively. The fourth stage 414 outputs second complimentary data ($\overline{Q2}$).

Figure 5:
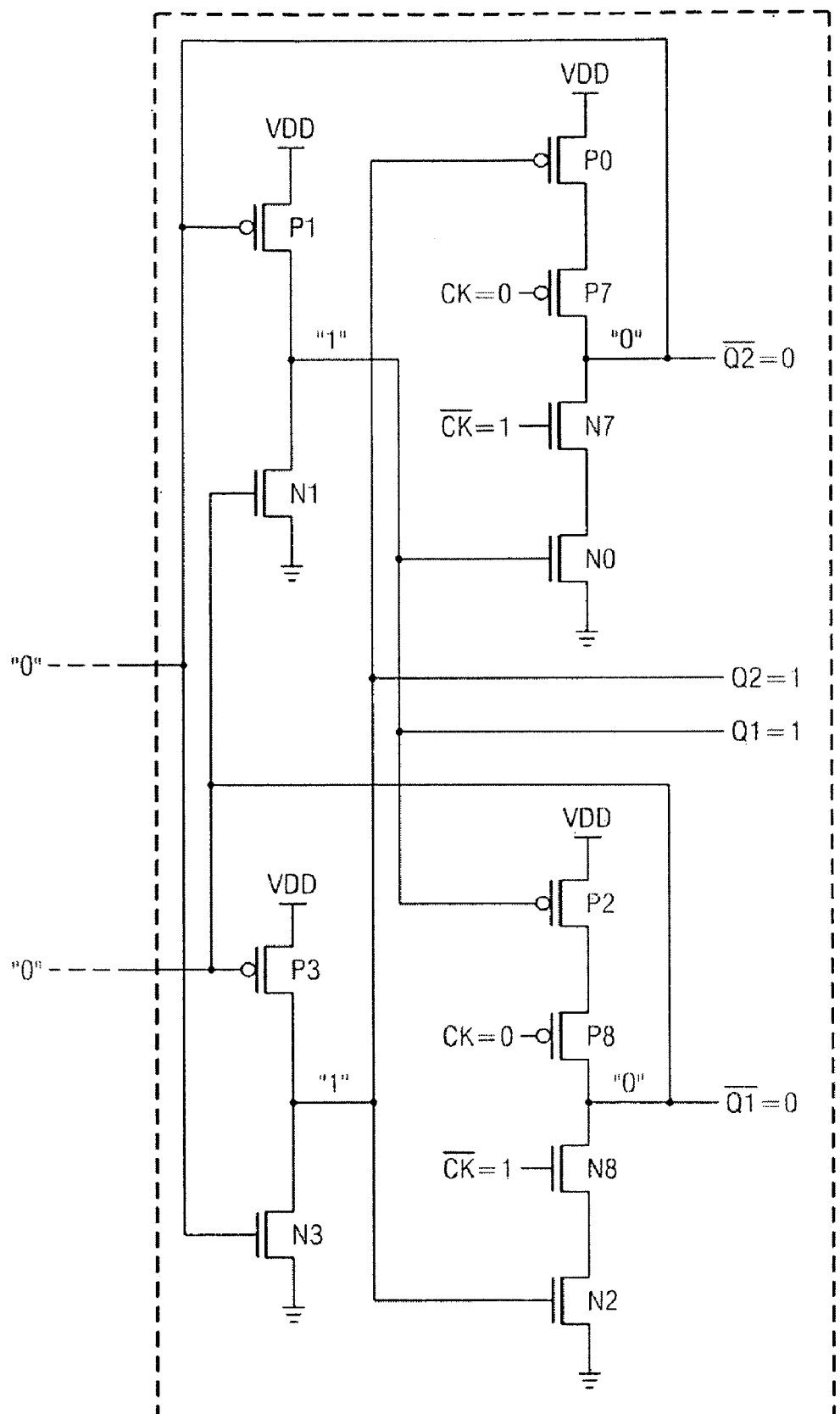
FIGS. 5-6 show bias conditions for the DICE memory element in two different data states.
Figure 6:
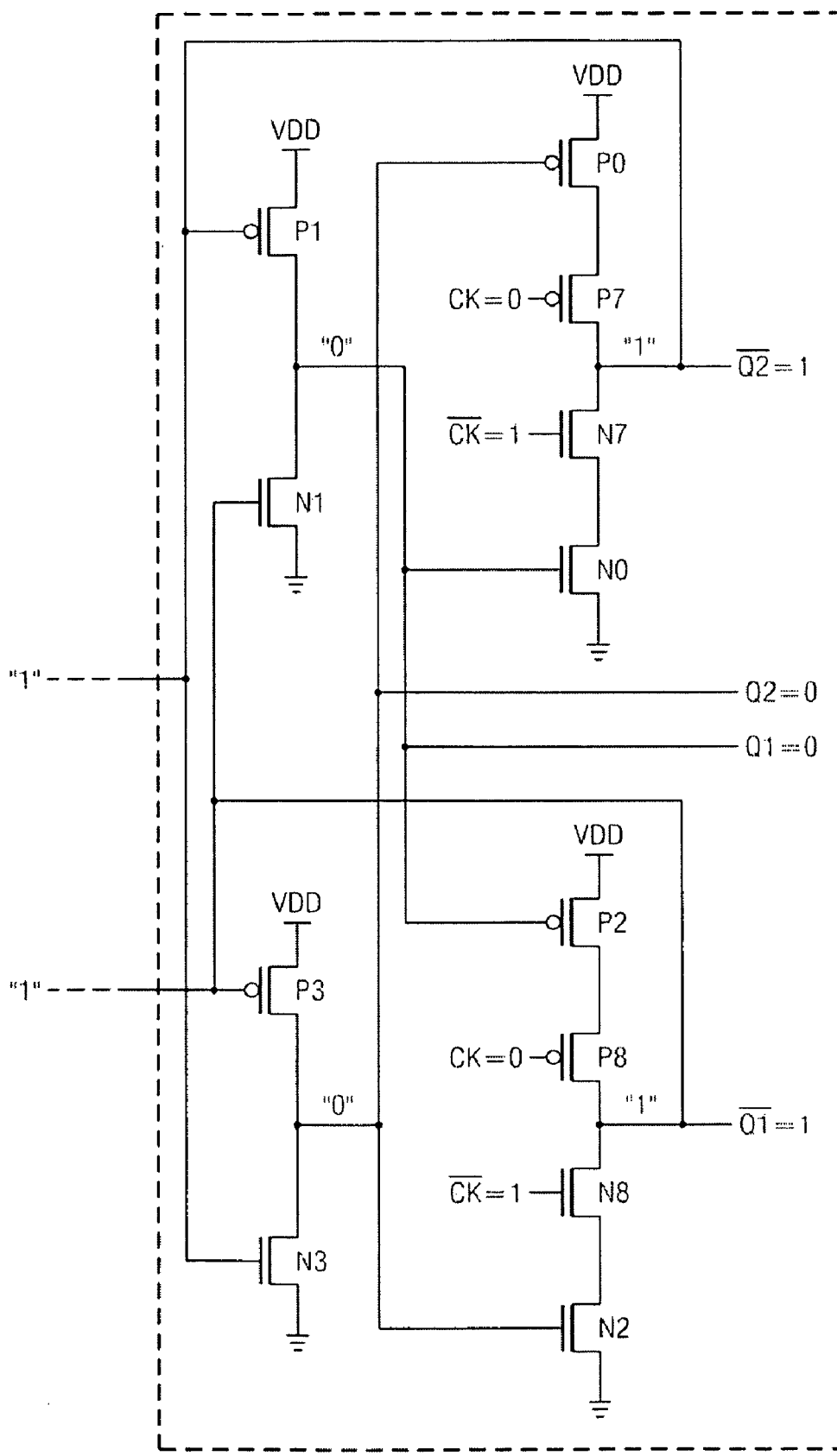

During operation, the control circuitry 406 provides suitable output signals so that DICE cell will store or "latch" the desired values on a clock pulse. For example, FIG. 5 shows an example where a "1" value is written to the DICE cell. FIG. 6 shows an example where a "0" value is written to the DICE cell. Although the figure is drawn with "1"s and "0"s superimposed thereon, it will be appreciated that a "1" in this respect represents a gate to source voltage (VGS) that is sufficient to turn on the NMOS transistors (i.e., greater than the voltage threshold (VT) of the NMOS transistors). Similarly, a "0" represents a gate-to-source voltage that is sufficient to turn on the PMOS transistors.

In regards to the DICE cell, if impacted by a single radiation event, the drains of N2 and N0 are particularly likely to cause single-event upsets. Therefore, in some embodiments, the drains of N2 and N0 will be separated by an isolation element to mitigate charge sharing therebetween.

Thus, in one approach, the drains of N2 and N0 will be separated from one another by a substantially large distance, for example, about 1 micron. In one embodiment, a P/N junction will separate the drains of N2 and N0. In another embodiment, a P/N junction will separate the drains of P2 and P0. In yet another embodiment, the drains of N2 and N0 are located in separated Pwell regions. In yet another embodiment, the drains of P2 and P0 are located in separated Nwell regions. Note that other nodes in the circuit may also be similarly separated and all such variations are contemplated as falling within the scope of the present concept.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory element disposed on a substrate, the memory element comprising:
    first and second interlocked data storage elements having first and second storage nodes, respectively, adapted to redundantly store datum; wherein an output of the first data storage element is coupled to an input node of the second data storage element, and an output of the second data storage element is coupled to an input of the first data storage element; and
    an isolation element in the substrate arranged laterally between storage nodes of the first and second data storage elements, where the isolation element is arranged to limit charge sharing between the storage nodes of the first and second data storage elements.

2. The memory element of claim 1, wherein the first data storage element comprises a first transistor having a first conductivity type and the second data storage element comprises a second transistor having the first conductivity type; and
    wherein the isolation element comprises separately isolated wells having the second conductivity type for the first and second transistors.

3. The memory element of claim 1, wherein the first data storage element comprises a first transistor having a first conductivity type and the second data storage element comprises a second transistor having the first conductivity type, where the isolation element comprises a region of the substrate between the first and second transistors having a length of at least about one micron.

4. The memory element of claim 1, where the isolation element comprises a shallow-trench isolation (STI) region.

5. The memory element of claim 1, wherein the first and second data storage elements both receive a common clock signal.

6. The memory element of claim 1, where the first data storage element comprises:
    a first stage having an input and an output; where the input of the first stage is coupled to the output of the second data storage element and where the output of the first stage is adapted to provide the datum; and
    a second stage coupled to the output of the first stage, the second stage adapted to provide complimentary datum to the output node of the first data storage element, the complimentary datum representing data opposite of the datum cooperatively stored in the first and second data storage elements.

7. The memory element of claim 6, where the second data storage element comprises:
    a third stage having an input and an output; where the input is coupled to the output node of the first data storage element and where the output is adapted to provide the datum; and
    a fourth stage coupled to the output of the third stage, the fourth stage adapted to provide complimentary datum to the output node of the second data storage element.

8. The memory element of claim 7, wherein an n-well is arranged to adjoin a p-type region at a p-n junction, the p-n junction lies between the second and fourth stages to mitigate charge sharing therebetween.

9. The memory element of claim 1, wherein the first and second data storage elements comprise interlocked data inverting stages.

10. A dual interlocked storage cell (DICE) memory element disposed on a substrate and comprising first and second interlocked data storage elements adapted to cooperatively store a datum:
    the first data storage element comprising:
        a first stage adapted to receive a second complimentary datum at its input and adapted to provide a first datum at its output; and
        a second stage coupled to the output of the first stage, the second stage adapted to provide a first complimentary datum at an output of the second stage;
    the second data storage element comprising:
        a third stage adapted to receive the first complimentary datum from the output node of the second stage and adapted to provide a second datum at an output of the third stage; and
        a fourth stage coupled to the output of the third stage, the fourth stage adapted to provide the second complimentary datum back to the first stage; and
    an isolation element in the substrate arranged laterally between the first and second data storage elements, where the isolation element is arranged to limit charge sharing between the first and second data storage elements.

11. The DICE memory cell of claim 10, where the first datum and second datum represent the same data value as the datum cooperatively stored in the first and second data storage elements.

12. The DICE memory cell of claim 11, further comprising:
    a controller adapted to provide a first control signal to the first and third stages.

13. The DICE memory cell of claim 12, where the controller is adapted to provide the first control signal to a PMOS transistor gate in the first stage and an NMOS transistor gate in the third stage.

14. The DICE memory cell of claim 12, where the controller is further adapted to provide a second control signal to both the first and third stages.

15. The DICE memory cell of claim 14, where the controller is adapted to provide the second control signal to an NMOS transistor gate in the first stage and a PMOS transistor gate in the third stage.

16. The DICE memory cell of claim 11, where the second stage receives a clock signal and an inverted clock signal and provides the first complementary datum as a function thereof.

17. The memory element of claim 11, where the isolation element comprises a region of the substrate having a length of at least about one micron, the region of substrate disposed between storage nodes of the first and second interlocked data storage elements.

18. The memory element of claim 11, where the isolation element comprises a shallow-trench isolation (STI) region disposed between storage nodes of the first and second interlocked data storage elements.

19. The memory element of claim 11, wherein the isolation element comprises separately isolated n-wells in which storage nodes of the first and second interlocked data storage elements collectively store data.

* * * * *